(12) United States Patent
Sharma et al.

(10) Patent No.: US 12,549,178 B2
(45) Date of Patent: Feb. 10, 2026

(54) VOLTAGE SUPPLY

(71) Applicant: Cirrus Logic International Semiconductor Ltd., Edinburgh (GB)

(72) Inventors: Kapil Sharma, Dalkeith (GB); Andrew J. Howlett, Edinburgh (GB); Matthew Petherbridge, Edinburgh (GB); John B. Bowlerwell, Dunfermline (GB); Graeme S. Angus, Edinburgh (GB); Gordon Russell, Dunfermline (GB)

(73) Assignee: Cirrus Logic Inc., Austin, TX (US)

( * ) Notice: Subject to any disclaimer, the term of this patent is extended or adjusted under 35 U.S.C. 154(b) by 87 days.

(21) Appl. No.: 18/483,727

(22) Filed: Oct. 10, 2023

(65) Prior Publication Data

US 2024/0154612 A1 May 9, 2024

Related U.S. Application Data

(60) Provisional application No. 63/423,127, filed on Nov. 7, 2022.

(30) Foreign Application Priority Data

Jan. 10, 2023 (GB) .................................... 2300349

(51) Int. Cl.
*H03K 17/687* (2006.01)
(52) U.S. Cl.
CPC ................................ *H03K 17/6871* (2013.01)
(58) Field of Classification Search
CPC ............ H03K 17/6871; H03F 2200/03; H03F 2200/33; H03F 2200/481; H03F 3/187; H03F 3/2173; H03F 1/30; H03F 3/185; H03F 3/3081; H03F 2200/186; H03F 2200/189; H01L 23/48; H01L 24/09; H01L 24/70; H10D 84/85
See application file for complete search history.

(56) References Cited

U.S. PATENT DOCUMENTS

| 6,272,736 B1 * | 8/2001 | Lee ......................... | H01C 1/032 |
| | | | 257/E27.047 |
| 2004/0017252 A1 | 1/2004 | Miyazaki | |
| 2004/0125968 A1 * | 7/2004 | Pearce .................. | H03F 3/2171 |
| | | | 257/E21.696 |

(Continued)

OTHER PUBLICATIONS

Combined Search and Examination Report under Sections 17 and 18(3), UKIPO, Application No. GB2300349.4, mailed Jul. 13, 2023.

*Primary Examiner* — Metasebia T Retebo
(74) *Attorney, Agent, or Firm* — Jackson Walker L.L.P.

(57) ABSTRACT

The application relates to voltage supply in switched-mode driver integrated circuit (IC). The IC has an output bridge with first and second circuit branches, where each of the circuit branches has an output node (102*a*, 102*b*) connected between first and second transistor switches (103*a*, 104*a*; 103*b*, 104*b*) for selectively connecting the output node to respective first and second voltages (VH, VL). There are discrete first and second IC die contacts (208*a*, 208*b*) for receiving the first voltage, and the first and second circuit branches are connected to the first and second IC die contacts respectively. Ancillary circuitry (105) is configured to receive a supply voltage from a voltage supply node voltage which is connected to the first and second IC die contacts via respective first and second respectively matched resistances.

20 Claims, 2 Drawing Sheets

(56) References Cited

U.S. PATENT DOCUMENTS

| | | |
|---|---|---|
| 2007/0252265 A1 | 11/2007 | Sander |
| 2008/0252372 A1 | 10/2008 | Williams |
| 2011/0101895 A1 | 5/2011 | Sattler |
| 2013/0223649 A1* | 8/2013 | Srivastava .......... H03F 3/45179 327/108 |
| 2015/0145582 A1 | 5/2015 | Hamond |
| 2023/0147195 A1* | 5/2023 | Eno ....................... H03F 3/2171 330/10 |

* cited by examiner

VOLTAGE SUPPLY

The present disclosure claims priority to U.S. Provisional Patent Application Ser. No. 63/423,127, filed Nov. 7, 2022, and United Kingdom Patent Application No. GB2300349.4, filed Jan. 10, 2023, each of which is incorporated by reference herein in its entirety.

FIELD OF DISCLOSURE

The field of representative embodiments of this disclosure relates to methods, apparatus and/or implementations concerning voltage supply, in particular for circuitry associated with a switched mode driver, such as a class-D driver, for driving a load in a bridge-tied-load configuration.

BACKGROUND

Switched mode drivers, such as class-D drivers and the like, are used in a variety of applications. For instance, class-D drivers may be used in some applications as amplifiers to drive audio output transducers or other output transducers.

A class-D driver may be implemented to drive a load in a bridge-tied-load arrangement, i.e. with a full-bridge configuration, and thus the output bridge may thus have first and second outputs for connection to either side of the load, with respective high-side and low-side switches on each side of the bridge for selectively connecting the relevant output to either a high-side or a low-side voltage respectively. In many applications, the class-D driver may be implemented as an integrated circuit (IC) and the integrated circuit die comprises suitable IC die contacts or terminals for receiving voltage supplies for the high-side and low-side supply voltages. In some implementations there may be a single IC die contact for receiving the relevant high-side voltage or the low-side voltage onto the IC, which is then supplied to both sides of the bridge. However, this arrangement can lead to issues with accurate sensing of current in the driver.

There may be some circuitry associated with the class-D driver that requires one or more supply voltages in use, for instance a power supply voltage. For example, gate drivers for driving the gates of transistors forming the switches of the output bridge and/or voltage regulation circuitry may require a supply voltage. Such circuitry, which will be referred to herein as ancillary circuitry, could be supplied with a supply voltage which is supplied to the IC separately to the high-side and low-side supplies, but in general it is desirable to minimise the number or area of the IC die contacts to minimise circuit area and cost.

SUMMARY

Embodiments of the present disclosure relate to methods, structures and apparatus for power supply for ancillary circuits of a switched mode driver. Embodiments of the present disclosure may at least mitigate at least some of the aforementioned issues.

According to an aspect of the disclosure there is provided a switched-mode driver integrated circuit (IC) comprising an output bridge comprising first and second circuit branches, wherein each of the first and second circuit branches comprises an output node connected between first and second transistor switches for selectively connecting the output node to respective first and second voltages. The IC also comprises discrete first and second IC die contacts for receiving a voltage supply for the first voltage, wherein the first circuit branch is connected to the first IC die contact and the second circuit branch is connected to the second IC die contact. A first intermediate supply node is connected to the first and second IC die contacts via respective first and second respectively matched resistances and ancillary circuitry configured to receive a supply voltage from said first intermediate supply node.

In some implementations the IC may further comprise separate third and fourth IC die contacts for receiving a voltage supply for the second voltage, wherein the first circuit branch is connected to the third IC die contact and the second circuit branch is connected to the fourth IC die contact, in which case the IC may further comprise a second intermediate supply node connected to the third and fourth IC die contacts via respective third and fourth respectively matched resistances, wherein the ancillary circuitry is further configured to receive a supply voltage from said second intermediate supply node.

The ancillary circuitry may, for example, comprise drivers for driving control terminals of the first and second transistor switches of each of the first and second circuit branches.

The first and second matched resistances may each have a resistance value which is higher than a resistance associated with the first and second IC die contacts in use. The resistance associated with the first and second IC die contacts may comprise a resistance of a package connection connecting the relevant first or second IC die contact to a package contact of an IC package comprising the integrated circuit. The first and second matched resistances may each have a resistance value which is at least twice the resistance associated with the first and second IC die contacts in use.

Additionally or alternatively, the first and second matched resistances each have a resistance value such that any voltage change across the first and second resistance due to current draw of the ancillary circuit during normal operation is insignificant for operation of the ancillary circuitry. The first and second matched resistances may each have a resistance value such that a defined current through the first or second resistance would result in a voltage drop of less than a predefined threshold, wherein the defined current corresponds to a maximum expected current draw of the ancillary circuitry from the first intermediate supply node and the predefined threshold corresponds to a voltage limit for a voltage at the first intermediate supply node for operation of the ancillary circuitry.

In some examples the first and second resistances may comprise thin-film resistors. In some examples the first and second resistances may comprise conductive tracks on the integrated circuit.

In some examples the switched-mode driver circuit may be an audio output driver for driving an audio output transducer.

Aspects also relate to an integrated circuit package comprising the switched-mode driver integrated circuit of any of the embodiments described herein. Each of the first and second IC die contacts may be connected to a first package contact for receiving the first voltage for the integrated circuit package. Aspects also relate to an electronic device comprising the switched-mode driver integrated circuit or the integrated circuit package of any of the embodiments described herein.

In an another aspect there is provided a switched-mode driver integrated circuit (IC) comprising: an output bridge comprising first and second circuit branches for selectively switching first and second output nodes respectively between first and second voltages; the first circuit branch being connected between first and second IC die contacts for voltage supplies for the first and second voltages respectively; the second circuit branch being connected between third and fourth IC die contacts for voltage supplies for the first and second voltages respectively; and ancillary circuitry configured to receive a supply voltage from a first intermediate supply node; wherein the first intermediate supply node is connected to first and third IC die contacts via respective first and second matched resistances.

The ancillary circuitry may further be configured to receive a supply voltage from a second intermediate supply node and the ancillary circuitry is configured to receive a supply voltage from a first intermediate supply node.

The first and second matched resistances may each have a resistance value which is higher than a resistance associated with the first and third IC die contacts in use. The first and second matched resistances may each have a resistance value such that any voltage change across the first and second resistance due to current draw of the ancillary circuit during normal operation is insignificant for operation of the ancillary circuitry.

In a further aspect there is provided a switched-mode driver integrated circuit comprising: an output bridge having first and second output terminals for driving a load in a bridge-tied-load configuration; circuitry for driving the output bridge; separate first and second IC die contacts for providing a first supply voltage to opposite sides of the bridge; and a first voltage supply node for providing a supply voltage to the circuitry for driving the output bridge, wherein the first voltage supply node is connected to the first and second IC die contacts by respective first and second matched resistances.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to methods and apparatus for voltage supply for circuitry which is associated with a switched mode driver, such as a class-D driver.

Figure 1:
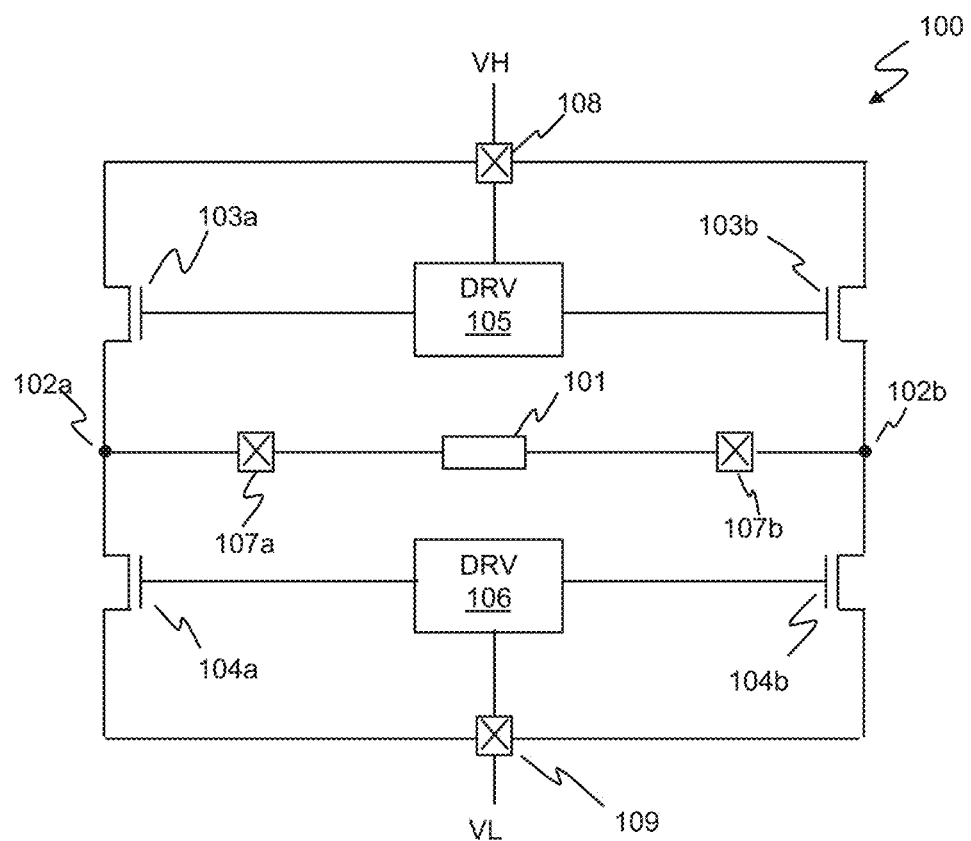
FIG. 1 illustrates one example of a conventional switched mode driver.

FIG. 1 illustrates one example of a conventional switched mode driver apparatus, in this case a class-D driver apparatus 100 for driving a load 101 in a bridge-tied-load (BTL) configuration, where both sides of the load are driven with driving signals so as to generate a desired differential output signal across the load. In some examples the load 101 could, for instance, be an audio output transducer such as loudspeaker or the like, and the class-D driver apparatus may drive the load based on an input audio signal (not illustrated), although it will be understood that such a driver may be used to drive other output transducers or other loads.

FIG. 1 illustrates that, in this example, the class-D driver has a full-bridge arrangement, sometimes also referred to as an H-bridge, with first and second output nodes 102a and 102b for connection to opposite sides of the load 101 via respective IC die contacts 107a and 107b. The H-bridge comprises a first circuit branch with first output node 102a connected between first and second switches 103a and 104a, where switch 103a is a first high-side switch and switch 104a is a first low-side switch, for selectively connecting the first output node 102a to a high-side voltage VH or a low-side voltage VL respectively.

Likewise, a second circuit branch, on the other side of the H-bridge, comprises output node 102b coupled between first and second switches 103b and 104b, where switch 103b is a second high-side switch and switch 104b is a second low-side switch for selectively connecting the second output node 102b to the high-side voltage VH or the low-side voltage VL respectively.

Note that as used herein, the terms high-side and low-side are used to mean more positive (or less negative) and less positive (or more negative) respectively and nothing is implied about the relative magnitudes of the voltages.

In many typical implementations the class-D driver will comprise an integrated circuit (IC), with the high-side and low-side switches 103a, 103b, 104a and 104b implemented as part of the IC by suitable transistors, for example the high-side switches 103a and 103b may be implemented as PMOS transistors and the low-side switches 103a and 103b may be implemented as NMOS transistors.

The transistors may be driven by suitable drivers for controlling a control node of the relevant transistor, e.g. gate drivers for driving the gates of MOS transistors as will be understood by one skilled in the art. FIG. 1 illustrates a high-side gate driver 105 for driving the high-side switch transistors 103a and 103b and a low-side gate driver 106 for driving the low-side switch transistors 104a and 104b, although it will be understood that other arrangements could be implemented. The gate drivers 105 and 106 drive the relevant transistors on or off in accordance with received control signals, e.g. based on an input signal, so as to modulate the voltages at output nodes 102a and 102b to provide the desired output signal. The output nodes 102a and 102b may comprise, or be connected to, respective suitable IC die contacts 107a and 107b, e.g. contact pads or the like, for outputting of the output signal.

In the example of FIG. 1, the voltage supplies for the high-side and low-side voltages VH and VL are each received on the integrated circuit die, i.e. chip, by a suitable IC die contact and the relevant IC die contact is connected, on the IC die, to the relevant switches for both the first and second circuit branches of the bridge. Thus, a high-side supply IC die contact 108, e.g. pad, on the IC die, receives a supply voltage for the high-side voltage VH and both of the first and second high-side switches 103a and 103b connect to this IC die contact 108. Likewise, a low-side supply IC die contact 109 receives the voltage supply for the low-side voltage VL and both of the low-side switches 104a and 104b are connected to this IC die contact 109. Thus, the high-side switches 103a and 103b effectively connect to a common on-chip high-side voltage node 108 and likewise both of the low-side switches 104a and 104b effectively connect to a common on-chip low-side voltage node 109.

As illustrated in FIG. 1, the gate drivers 105 and 106 may also be coupled to the IC die contacts 108 and 109 so as to also receive the relevant supply voltage. There may additionally or alternatively be other ancillary circuitry (not shown) which is connected to one or both of the IC die contacts 108 and/or 109 to receive a voltage supply, e.g. to be powered by the supply voltages.

As will be understood by one skilled in the art, practical implementations of the IC die contacts can result in spatial non-linearity of current in the first and second branches of the output H-bridge, which can impact the accuracy of current sensing in the output H-bridge.

The IC contact pads 108 and 109 will act as current sources and sinks for the relevant transistors of the first and second circuit branches. In practice, the IC die contacts 108 and 109 will need to have suitable dimensions, e.g. a suitable width, to safely operate with the maximum expected current through the IC die contact in normal use and the IC die contacts 108 and 109 will thus comprise a planar area of a conducting material, with the voltage supply connections being made to a part of this planar area. The die contacts 108 and 109 are thus not ideal point sources, and this can lead, in use, to a spatial non-uniformity of current density across the die contact and in the first or second circuit branches.

As noted, this spatial non-uniformity may cause issues with current sensing. As will also be understood by one skilled in the art, it may be desirable to perform current sensing of the current at one or more points in the class-D driver, e.g. in the first and second current branches, and such current sensing may be performed by sensing the voltage drop across a sense resistor (not illustrated). To limit power loss and heat dissipation via the sense resistor, the sense resistor may be implemented to have a relatively low resistance and may be formed from a suitable thin film resistive material such as, for example, tantalum nitride (TaN). In such current sensing resistors, the measurements may be taken at sense points across the resistor and the measurements will depend on the current density in the sense resistor between the sense points. A non-uniform current density in the sense resistor, which can arise from the non-uniform current density of the IC contact pad, can thus impact the accuracy of the measurement of current.

This can particularly be a problem if both sides of the H-bridge, i.e. both of the first and second branches, are connected to the same die-contact, as the non-uniformity of current across the die contact can result in non-uniformity of current in the first and second branches which differs between the first and second branches. Thus a first sense resistor in the first circuit branch could provide a different measurement to a second, identical, sense resistor in the second circuit branch for the same overall current in each circuit branch, due to the differences in spatial non-uniformity.

Figure 2:
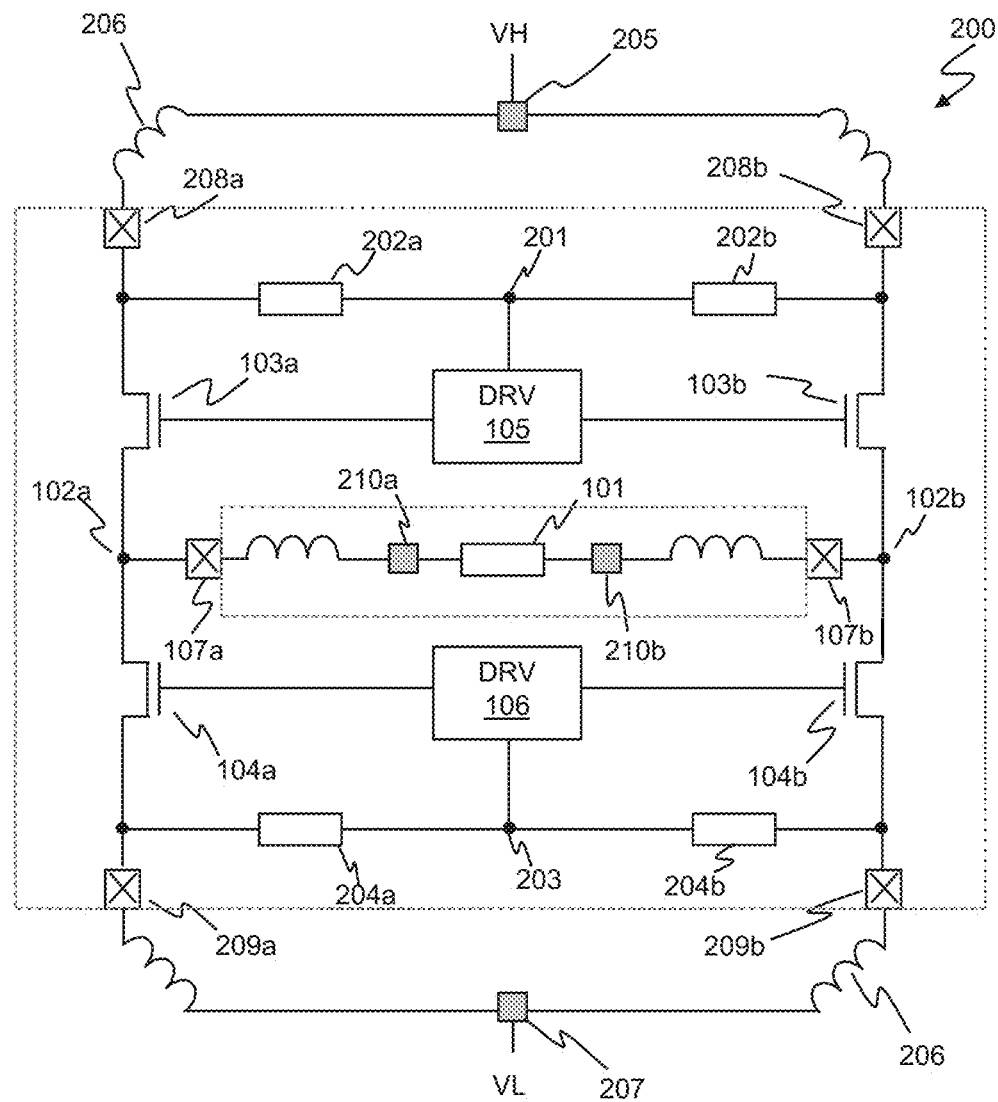
FIG. 2 illustrates a switched mode driver apparatus according to an embodiment.

In embodiments of the present disclosure there are separate IC die contacts on the integrated circuit die, i.e. on chip, for each side of the H-bridge for at least one of the supply voltages, e.g. VH and/or VL. FIG. 2 illustrates an example of a switched-mode driver apparatus 200 according to an embodiment, in which similar components as those discussed with reference to FIG. 1 are identified by the same reference numerals.

FIG. 2 illustrates that the driver apparatus has an output bridge with first and second circuit branches, each comprising a respective output node between first and second switches. The first circuit branch comprises first output node 102a connected between first high-side and first low side-transistors 103a and 104a and the second circuit branch comprises second output node 102b connected between first and second low side-transistors 103b and 104b. As discussed with reference to FIG. 1, the apparatus also has transistor drivers for driving control nodes of the transistors. For instance, gate driver 105 may drive the high-side transistors 103a and 103b, which may, for example, be PMOS devices and gate driver 106 may drive the low-side transistors 104a and 104b, which may, for example, be NMOS devices, although other arrangements are possible.

In the example of FIG. 2 there are separate IC die contacts for each of the first and second branches of the bridge for each of the voltage supplies for the high-side and low-side voltages VH and VL.

FIG. 2 thus illustrates that there is a first high-side supply IC die contact 208a, e.g. an IC die contact pad or the like, for receiving the voltage supply for the high-side voltage VH on the IC die for the first branch of the bridge, i.e. on one side of the bridge, and a second, separate, high-side supply IC die contact 208b for receiving a voltage supply on the IC die for the high-side voltage VH for the second branch of the bridge, i.e. on the other side. Thus, the voltage supply for the high-side voltage VH for the first branch of the bridge is received on the IC die separately from the voltage supply for the high-side voltage VH for the second branch of the bridge. The first high-side switch transistor 103a is coupled to the first high-side IC die contact 108a and the second high-side switch transistor 103b is separately coupled to the second high-side IC die contact 108b. Likewise, in this example, there are separate first and second low-side supply IC die contacts 109a and 109b for separately receiving voltage supplies for the low-side voltage VL and which are separately connected to the first and second low-side switches 104a and 104b respectively. Thus, the first circuit branch extends from the first high-side IC die contact 208a to the first low-side IC die contact 209a and the second circuit branch extends from the separate second high-side IC die contact 208b to the separate second low-side IC die contact 209b.

This arrangement can reduce the variability in spatial non-uniformity of current density that could negatively impact current sensing due to both high-side or low-side transistors being connected to the same IC die contact, although it does require two IC die contacts for receiving each of the high-side and low-side supply voltages. The configuration of the connection of the first and second circuit branches to the respective high-side IC die contacts 208a and 208b can be matched, i.e. the layout connection of the first high-side transistor 103a to the first high-side IC die contact 208a (together with any sense resistor) can be matched to the layout of the connection of the second high-side transistor 103b to the second high-side IC die contact 208a (together with any sense resistor), so as to minimise any differences between the first and second current branches.

To provide supply voltages for the ancillary circuitry, e.g. for gate drivers 105 and 106, a respective on-chip supply node is coupled to both of the relevant high-side supply or low-side supply IC die contacts via respective resistances. Thus, a high-side supply node 201 on the IC die is coupled to the high-side supply IC die contacts 208a and 208b by respective first and second high-side resistances 202a and 202b. The resistances 202a and 202b may be matched resistances, i.e. designed to have the same resistance value as one another. The resistances 202a and 202b may also be designed and laid out on the integrated circuit so as to generally minimise any process, voltage or temperature (PVT) variations in use and so as, in use, to have generally matching geometries with respect to the IC die contacts 208a and 208b and the transistors 103a and 103b.

Likewise, in the example of FIG. 2, an on-chip low-side supply node 203 is coupled to the low-side supply IC die contacts 209a and 209b by respective first and second low-side resistances 204a and 204b, which similarly may be matching resistances. Note the low-side resistances 204a and 204b may advantageously match one another, and in some cases the resistance value of the low-side resistances may be substantially the same as the resistance value of the high-side resistances 202a and 202b, but in some implementations the low-side resistances may have a different resistance value to the high-side resistances.

The voltages at the on-chip supply nodes 201 and 203 can be used as supply voltages for the ancillary circuitry, such as the gate drivers 105 and/or 106. FIG. 2 illustrates that the gate driver 105 is connected to the high-side supply node 201 and the gate driver 106 is connected to the low-side supply node 106, but it will be understood that in some implementation one or more of the driver circuits and/or some other ancillary circuitry could be connected to both of the high-side and low-side supply nodes 201 and 203. FIG. 2 illustrates both and high-side supply node 201 and a low-side supply node 203 which deriving voltages for the ancillary circuitry from the relevant IC die contacts, but in some cases only one of these supply voltages may be required.

Providing the supply voltages in this way, derived from both the relevant supply IC die contacts via first and second resistances, is advantageous in that it can reduce the impact on spatial non-uniformity of current in the first or second branches of the bridge which could negatively affect the accuracy of any current sensing, as compared to the ancillary circuit being connected to just one of the supply IC die contacts without any significant resistance.

In addition, deriving the internal, or on chip, supply voltages for the ancillary circuitry in this way can reduce the impact of any voltage spikes or transients at the relevant IC die contact, e.g. due to operation of the class-D driver.

As will be understood by one skilled in the art, there may be some inductance associated with the supply IC die contacts, which may be at least partly due to off-chip components. For instance, it will be understood that the IC die will generally be implemented as part of an IC package, for instance a QFN (quad flat no leads) package or similar. The IC die contacts will thus typically be connected to corresponding package contacts, e.g. pins, via suitable connections, e.g. bond wires and/or conductive paths of a redistribution layer or the like. FIG. 2 illustrates that the high-side supply IC die contacts 208a and 208b may both be connected to the same high-side supply package contact 205. The issues of spatial non-uniformity of current density apply to the current density in the integrated circuit die, so the two high-side supply IC die contacts 208a and 208b can be connected to the same package contact 205, to avoid the need for two separate package contacts, without any significant detriment to current sensing. The high-side supply IC die contacts 208a and 208b are connected to the high-side supply package contact 205 via connections 206, such as bond wires, that may have some inherent or parasitic inductance. Similarly, the low-side supply IC die contacts 209a and 209b may be connected to a corresponding low-side supply package contact 207 via bond wires or other connections 206.

For completeness FIG. 2 also indicates that the IC die contacts 107a and 107b for outputting the output signal from both the first and second branches of the bridges may be connected to respective output package contacts 210a and 210b by suitable package connections 206.

In operation of the class-D driver, the switching of the high-side and low-side switches of the first and second branches of the output bridge can result in a relatively rapid change in current flowing through the relevant switches, and hence via the relevant IC die contact and associated connections 206 i.e., inductances, which can result in a voltage transient. As will be understood, each branch of the bridge will switch between different states with a controlled duty cycle. In one state the high-side switch is 'on' and the low-side switch is 'off', and in another state the high-side switch is 'off' and the low-side switch is 'on'. As each branch on opposite sides of the bridge switches between these states, the current through the relevant transistor, and hence through the relevant IC die contact can change rapidly and the corresponding change in current through the associated inductance can result in a voltage transient at the relevant IC die contact.

For instance, if, in use, a load current is flowing to the load 101 from the first circuit branch at the time when the first circuit branch switches from the state, where the high-side switch transistor 103a is 'off' and the low-side switch transistor 104a is 'on', to the opposite state, where the high-side switch transistor 103a is 'on' and the low-side switch transistor 104a is 'off', the load current will cease flowing via low-side switch transistor 104a (typically including a period of conduction via a body diode of transistor 104a during a dead-time when both transistors 103a and 104a are 'off' as part of the state transition) and will start flowing via the high-side switch transistor 103a when it turns 'on'. Thus, the current flowing via low-side supply IC die contact 209a and associated inductances, e.g. the parasitic inductances of the package connections 206, will rapidly ramp to zero and the current through the high-side supply IC die contact 208a and associated parasitic inductances, e.g. of elements 206, will rapidly ramp upwards, resulting in voltage transients at the IC die contacts 208a and 209a. Such voltage transients could potentially cause issues for the ancillary circuitry if the ancillary circuitry were directly connected to the relevant IC die contact. For instance, a voltage spike at the IC die contact 208a could potentially result in a change in the gate voltage output from the gate driver 105 which could potentially cause incorrect operation of the high-side switch transistors 103a and 103b.

In embodiments of the present disclosure, the first and second resistances 202a and 202b (or 204a and 204b) reduce the impact of any such voltage transients at the supply node and hence reduce the impact on the ancillary circuitry.

Considering the high-side supply node 201, in the case where the voltage at each of the high-side supply IC die contacts 208a and 208b are the same as one another, e.g. equal to the high-side supply voltage VH, then the voltage of the supply node 201 will also be substantially equal to this voltage. If the voltage at the high-side supply IC die contact 208a changes due to a transient, say spikes to a voltage of VH+ΔV, then if the voltage at the other high-side supply IC die contact 208b remains at VH, the first and second resistances 202a and 202b effectively act as a potential divider and the voltage at the high-side supply node 201 will only spike be VH+ΔV/2, i.e. the magnitude of the transient is halved (assuming matched resistances). Similar issues can apply for the low-side supply IC die contacts 209a and 209b and again the low-side supply node 203 will experience only half of the magnitude of a transient at one of the low-side supply IC die contacts 209a or 209b.

Thus, for any transient that affects the voltage at one of the relevant supply IC die contacts, i.e. one of the IC die contacts 208a and 208b or one of the IC die contacts 209a and 209b, the relevant supply node will only experience half the transient due to the supply node being an intermediate node between the matched first and second resistances, which reduces the likelihood of transients adversely affecting the operation of the ancillary circuitry.

It will be noted that it would be possible to provide the relevant supply voltage for the ancillary circuitry via a dedicated IC die contact which is separate to either of the relevant supply IC die contacts to which the first and second branches of the bridge are respectively connected, however this would require an additional IC die contact and each IC die contact generally adds to the area and cost of the relevant integrated circuit. In general, therefore it is desirable to minimise the number of IC die contacts where possible.

As noted above, the first and second resistances 202a and 202b (or 204a and 204b) act as a potential divider to reduce the effect of any voltage transients at the relevant intermediate supply node 201 or 203. The first and second resistances may advantageously have a resistance value which is low enough such that any voltage across the first or second high-side resistance due to any current draw by the ancillary circuitry, e.g. by the gate drivers 105 or 106, is relatively low, e.g. the voltage drop across either of the or second resistances due to any current draw of the ancillary circuitry is minimal or insignificant, i.e. is minimal or insignificant for operation of the ancillary circuitry in terms of correct operation of the ancillary circuitry. The value of the first and second resistances may thus be low enough so that any variation in voltage at the intermediate supply node with current draw by the ancillary circuit is relatively low and the voltage at the intermediate supply node can be used as a supply voltage for the ancillary circuitry without problems. The extent of any voltage change across the first and second resistance which is acceptable may vary depending on the application and the values of the relevant high-side and low-side voltages in use, but in some applications the resistance of first and second resistances such that a defined current, which corresponds to a maximum current draw of the ancillary circuitry from the intermediate supply node expected in normal use, passing through the resistance would result in a voltage change across the resistance of no more than a predefined limit. The predefined limit may be defined based on a voltage limit for the intermediate supply node for error free operation of the ancillary circuitry, taking into account the effects of the possible transients at the IC die contacts. In some cases the predefined limit could be set to be 2% or 1% or 0.5% or less of the voltage difference between the high-side and low-side voltages.

However, the resistance of the first and second resistances together in series may advantageously be higher than a resistance associated with each of the supply IC die contacts, e.g. a parasitic impedance of the connections 206 to the supply IC die contacts. Thus, the resistance of the first and second resistances together in series may advantageously be higher than the parasitic impedance of the connections 206 to the package contact 205. In some implementations the resistance of each of the first and second resistances may be significantly higher than the parasitic impedance of the supply connections, for instance in some case the resistance of the first and second resistances could be at least two, three, four or five or more times the parasitic impedance of the package connections 206, e.g. bond wires. Providing the first and second resistances with resistance values that are greater than the parasitic impedances resistances of the supply connections, e.g. the package connections 206, means that any load current through the relevant side of the bridge will predominantly flow via the supply IC die contact and external supply connections rather than flowing to/from the other side of the bridge via the first and second resistances, which could, as discussed above, adversely impact the spatial uniformity of current density.

Purely by way of example, the parasitic impedance of the connections 206, e.g. bond wires, may, in some implementations, be of the order of a few milliohms or tens or milliohms or so. The resistance of the first and second resistances could be of a few hundred milliohm or of the order of an ohm or a few ohms or so.

For example, in one implementation the package connections could have parasitic impedance values in a range of 5-20 mΩ inclusive. In such a case the first and second resistances could have resistance values in a range of the order of 0.25-1.5Ω or so inclusive. It will be understood however that other resistance values may be implemented depending on the application.

The first and second resistances 202a and 202b and/or 204a and 204b may be implemented by any suitable resistance. In some applications the resistances could, at least partly, be implemented by thin film resistors or a suitable resistive material such as TaN or the like. However, in some cases the resistances may be formed by suitable conductive, e.g. metallic, tracks formed as part of the integrated circuit die.

Embodiments of the present disclosure thus relate to a switched mode driver integrated circuit with an output bridge comprising first and second circuit branches on opposite sides of the bridge and where a high-side voltage and/or a low-side voltage for the bridge is supplied separately to the two sides of the bridge, i.e. is received by discrete or separate respective IC die contacts onto the die for each of the first and second circuit branches. It will be noted that FIG. 2 illustrates, for the purposes of explanation, components of the integrated circuit die itself and also some off chip components, that may for instance be included in an IC package. The components that may be integrated onto the IC die are illustrated as being those bounded by the inner and outer dotted boxes.

FIG. 2 illustrates where each of the first and second circuit branches is connected to one respective high-side IC die contact and one respective low-side IC die contact. In some embodiments, however, each of the circuit branches may be connected to more than one high side IC die contact and/or more than one low-side IC die contact. Thus there could be a first plurality of IC die contacts for receiving the high-side voltage for the first circuit branch and a second plurality of separate or discrete IC die contacts for receiving the high-side voltage for the second circuit branch. Providing a plurality of IC die contacts for the high-side and/or the low-side supply voltages for each of the circuit branches may be advantageous in some cases in reducing the effects of electromigration, as will be understood by one skilled in the art. Thus, rather than providing a single continuous contact which is suitably dimensioned to provide all the required load current that may be required in use, a plurality of different contact regions may be provided that are configured to collectively provide the required current. In effect the single IC die contact can be thought of as being subdivided into a plurality of IC die contacts which are all connected to the relevant circuit branch and which operate collectively.

In the case where there are a plurality of IC die contacts for providing the high-side or low-side supply voltages for each of the first and second circuit branches respectively, the relevant intermediate supply node may be connected to any number of the relevant IC die contacts for the first circuit branch via the first resistance and to any number of the relevant IC die contacts for the second circuit branch via the second resistance. Thus, for instance, the intermediate supply node could be connected to just one of the relevant high-side or low-side IC die contacts for the first circuit branch via the first resistance and just one of the relevant high-side or low-side supply IC die contacts for the second circuit branch via the second resistance. Alternatively the intermediate supply node could be connected, via the first resistance to more than one or all of the relevant IC die contacts for the first circuit branch and connected, via the second resistance to more than one or all of the relevant IC die contacts for the second circuit branch.

In general, therefore, the first and second circuit branches may be connected to respective first and second sets of high-side IC die contacts, where each of the first and second sets of high-side IC die contacts comprises one or more IC contacts and the IC die contacts of the first set of high-side IC die contacts are all different to the IC die contacts of the second set of high-side IC die contacts. A high-side intermediate supply node may be connected to at least one of the first set of high-side IC die contacts via a first high-side resistance and connected to at least one of the second set of high-side IC die contacts via a second high-side resistance. Additionally or alternatively the first and second circuit branches may be connected to respective first and second sets of low-side IC die contacts, where each of the first and second sets of low-side IC die contacts comprises one or more IC contacts and the IC die contacts of the first set of low-side IC die contacts are all different to the IC die contacts of the second set of low-side IC die contacts. A low-side intermediate supply node may be connected to at least one of the first set of low-side IC die contacts via a first low-side resistance and connected to at least one of the second set of low-side IC die contacts via a second low-side resistance.

Embodiments of the present disclosure thus generally relate to a switched mode driver integrated circuit with an output bridge comprising first and second circuit branches, where each of the first and second branches comprises a respective output node located between first and second switches, e.g., between high-side and low-side transistors. Each of the circuit branches is connected between IC die contacts for receiving first and second voltages and an IC die contact for providing the first voltage to the first circuit branch is different to an IC die contact for providing the first voltage to the second circuit branch, i.e., the first voltage is received on the IC separately for each of the first and second branches. A first voltage supply node is connected to the IC die contact for providing the first voltage to the first circuit branch by a first resistance and also to the IC die contact for providing the first voltage to the first circuit branch by a second resistance. The first and second resistances may be substantially matched to one another. At least some ancillary circuitry is configured to be supplied with a voltage from the first voltage supply node.

In some embodiments the first and second circuit branches could share the same IC die contact for receiving the second voltage, but in at least some embodiments the IC die contact for providing the second voltage to the first circuit branch is different to the IC die contact for providing the second voltage to the second circuit branch, i.e. the second voltage is also received on the IC separately for each of the first and second branches. Thus, each of the first and second circuit branches may be connected between different IC terminals. In this case a second voltage supply node may be connected to the IC die contact for providing the second voltage to the first circuit branch by a third resistance and also to the IC die contact for providing the second voltage to the first circuit branch by a fourth resistance and the third and fourth resistance may be matched resistance.

It will be understood that one of the supply voltages could be ground, e.g. the high-side voltage could be a positive supply voltage and the low-side voltage could be ground and that a reference to receiving a supply voltage includes receiving a ground voltage.

Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A switched-mode driver integrated circuit (IC) comprising:
an output bridge comprising first and second circuit branches, wherein:
each of the first and second circuit branches comprises an output node connected between first and second transistor switches for selectively connecting the output node to respective first and second voltages;
discrete first and second IC die contacts for receiving a voltage supply for said first voltage, wherein the first circuit branch is connected to the first IC die contact and the second circuit branch is connected to the second IC die contact;
a first intermediate supply node connected to the first and second IC die contacts via respective first and second respectively matched resistances; and
ancillary circuitry configured to receive a supply voltage from said first intermediate supply node.

2. The switched-mode driver integrated circuit of claim 1 further comprising separate third and fourth IC die contacts for receiving a voltage supply for said second voltage, wherein the first circuit branch is connected to the third IC die contact and the second circuit branch is connected to the fourth IC die contact.

3. The switched-mode driver integrated circuit of claim 2 further comprising a second intermediate supply node connected to the third and fourth IC die contacts via respective third and fourth respectively matched resistances, wherein the ancillary circuitry is further configured to receive a supply voltage from said second intermediate supply node.

4. The switched-mode driver integrated circuit of claim 1 wherein the ancillary circuitry comprises drivers for driving control terminals of the first and second transistor switches of each of the first and second circuit branches.

5. The switched-mode driver integrated circuit of claim 1 wherein the first and second matched resistances each have a resistance value which is higher than a resistance associated with the first and second IC die contacts in use.

6. The switched-mode driver integrated circuit of claim 5 wherein the resistance associated with the first and second IC die contacts comprises a resistance of a package connection connecting the relevant first or second IC die contact to a package contact of an IC package comprising the integrated circuit.

7. The switched-mode driver integrated circuit of claim 5 wherein the first and second matched resistances each have a resistance value which is at least twice the resistance associated with the first and second IC die contacts in use.

8. The switched-mode driver integrated circuit of claim 1 wherein the first and second matched resistances each have a resistance value such that any voltage change across the first and second resistance due to current draw of the ancillary circuit during normal operation is insignificant for operation of the ancillary circuitry.

9. The switched-mode driver integrated circuit of claim 1 wherein the first and second matched resistances each have a resistance value such that a defined current through the first or second resistance would result in a voltage drop of less than a predefined threshold, wherein the defined current corresponds to a maximum expected current draw of the ancillary circuitry from the first intermediate supply node and the predefined threshold corresponds to a voltage limit for a voltage at the first intermediate supply node for operation of the ancillary circuitry.

10. The switched-mode driver integrated circuit of claim 1 wherein the first and second resistances comprise thin-film resistors.

11. The switched-mode driver integrated circuit of claim 1 wherein the first and second resistances comprise conductive tracks on the integrated circuit.

12. The switched-mode driver integrated circuit of claim 1 wherein the switched-mode driver circuit is an audio output driver for driving an audio output transducer.

13. An integrated circuit package comprising the switched-mode driver integrated circuit of claim 1.

14. The integrated circuit package of claim 13 wherein each of the first and second IC die contacts are connected to a first package contact for receiving the first voltage for the integrated circuit package.

15. An electronic device comprising the switched-mode driver integrated circuit of claim 1.

16. A switched-mode driver integrated circuit (IC) comprising:
- an output bridge comprising first and second circuit branches for selectively switching first and second output nodes respectively between first and second voltages;
- the first circuit branch being connected between first and second IC die contacts for voltage supplies for the first and second voltages respectively;
- the second circuit branch being connected between third and fourth IC die contacts for voltage supplies for the first and second voltages respectively; and
- ancillary circuitry configured to receive a supply voltage from a first intermediate supply node;
- wherein the first intermediate supply node is connected to first and third IC die contacts via respective first and second matched resistances.

17. The switched-mode driver integrated circuit of claim 16 wherein the ancillary circuitry is further configured to receive a supply voltage from a second intermediate supply node and the ancillary circuitry is configured to receive a supply voltage from a first intermediate supply node.

18. The switched-mode driver integrated circuit of claim 16 wherein the first and second matched resistances each have a resistance value which is higher than a resistance associated with the first and third IC die contacts in use.

19. The switched-mode driver integrated circuit of claim 16 wherein the first and second matched resistances each have a resistance value such that any voltage change across the first and second resistance due to current draw of the ancillary circuit during normal operation is insignificant for operation of the ancillary circuitry.

20. A switched-mode driver integrated circuit comprising:
- an output bridge having first and second output terminals for driving a load in a bridge-tied-load configuration;
- circuitry for driving the output bridge;
- separate first and second IC die contacts for providing a first supply voltage to opposite sides of the bridge; and
- a first voltage supply node for providing a supply voltage to the circuitry for driving the output bridge, wherein the first voltage supply node is connected to the first and second IC die contacts by respective first and second matched resistances.

* * * * *